United States Patent [19]

Carter

[11] Patent Number: 4,706,216
[45] Date of Patent: Nov. 10, 1987

[54] CONFIGURABLE LOGIC ELEMENT
[75] Inventor: William S. Carter, Santa Clara, Calif.
[73] Assignee: Xilinx, Inc., San Jose, Calif.
[21] Appl. No.: 706,429
[22] Filed: Feb. 27, 1985
[51] Int. Cl.[4] .............................................. G11C 13/00
[52] U.S. Cl. ...................................... 365/94; 365/103; 365/154
[58] Field of Search .................. 365/94, 103, 154, 189, 365/230

[56] References Cited
U.S. PATENT DOCUMENTS
3,967,251 6/1976 Levin ..................................... 365/94

Primary Examiner—Terrell W. Fears
Attorney, Agent, or Firm—Alan H. MacPherson; Richard Franklin; Edel M. Young

[57] ABSTRACT

A configurable logic circuit achieves versatility by including a configurable combinational logic element, a configurable storage circuit, and a configurable output select logic. The input signals to the configurable combinational logic element are input signals to the configurable logic circuit and feedback signals from the storage circuit. The storage circuit may be configured to operate as a D flip flop with or without set and reset inputs, an RS latch, a transparent latch with or without set and reset inputs, or as an edge detector. In conjunction with the combinational logic element, the storage circuit may also operate as a stage of a shift register or counter. The output select logic selects output signals from among the output signals of the combinational logic element and the storage circuit.

21 Claims, 20 Drawing Figures

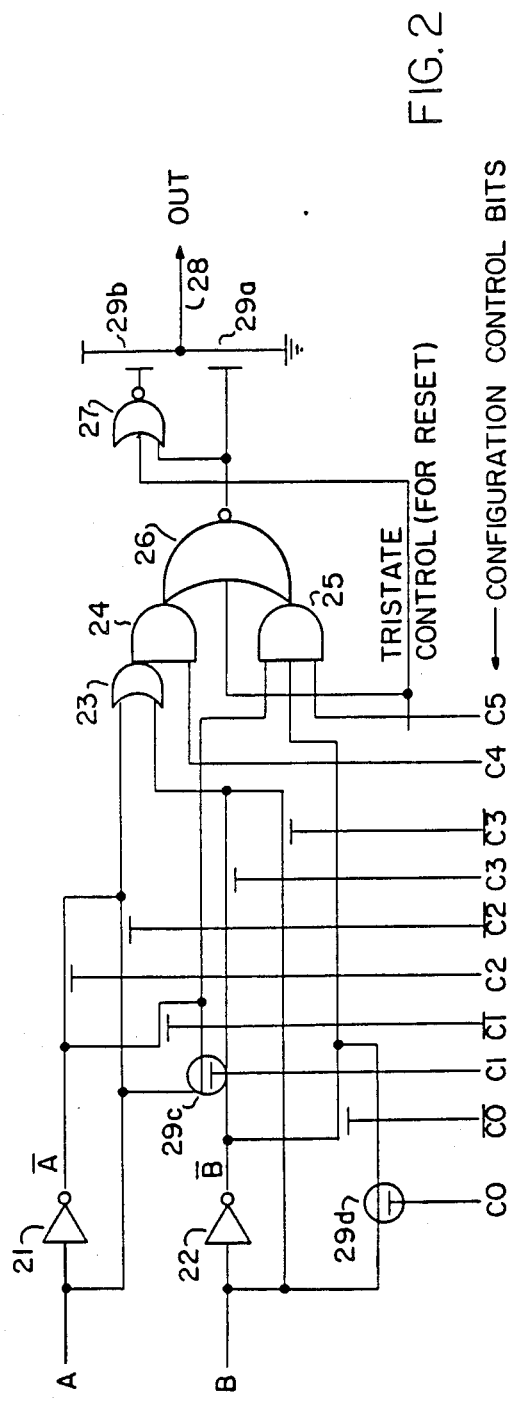
FIG. 2
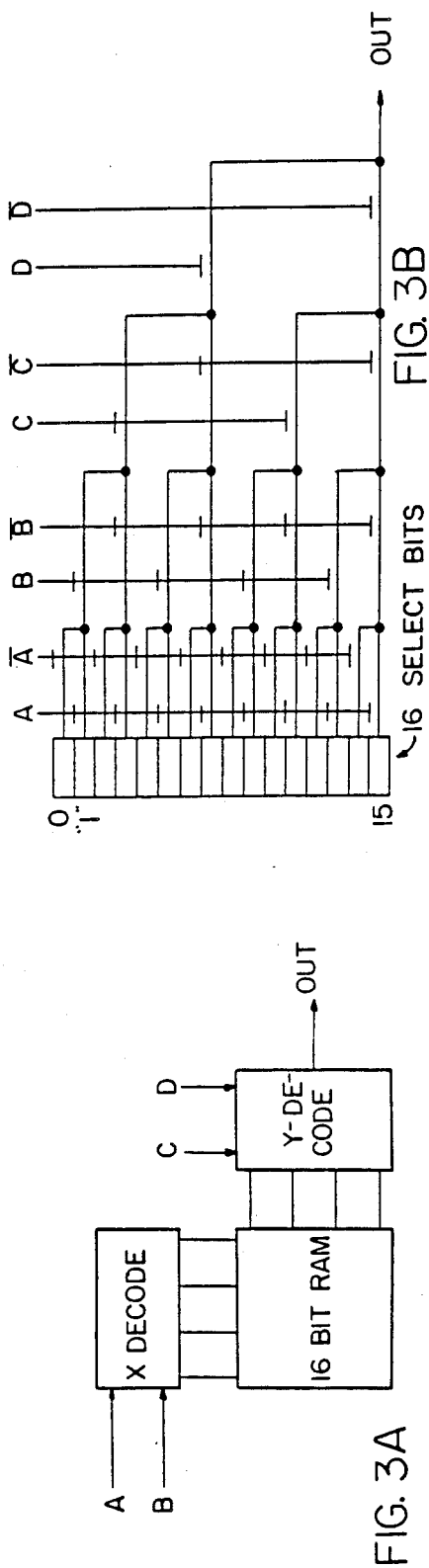
FIG. 3B
FIG. 3A

|   |   | C | 0 | 1 | 1 | 0 |
|---|---|---|---|---|---|---|
| A |   | D | 0 | 0 | 1 | 1 |
|   | B |   |   |   |   |   |
| 0 | 0 |   | 1 | 0 | 0 | 0 |
| 1 | 0 |   | 0 | 0 | 0 | 0 |
| 1 | 1 |   | 0 | 0 | 0 | 0 |
| 0 | 1 |   | 0 | 0 | 0 | 0 |

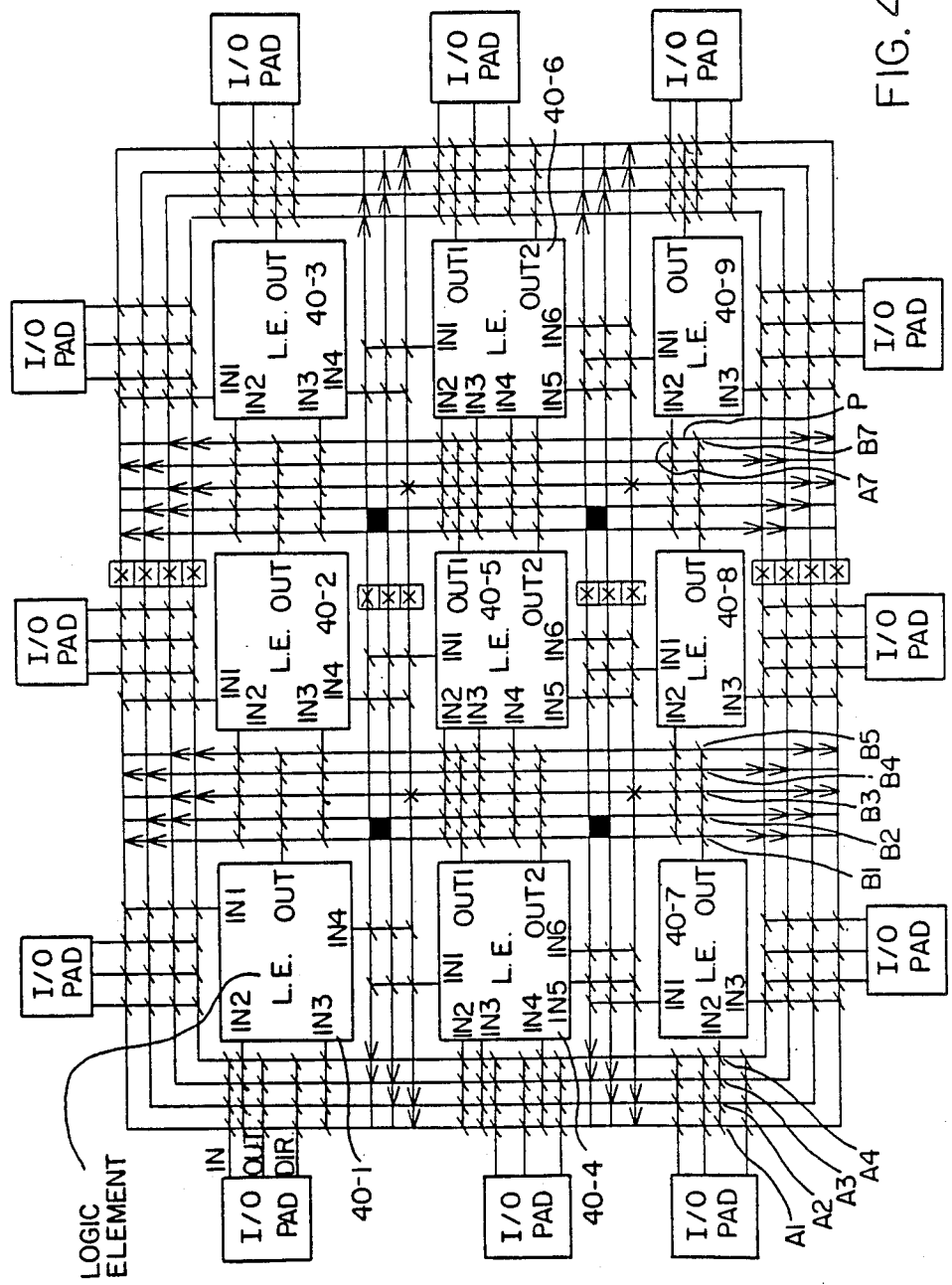

─┼─ = ─┼╲┼─ (i.e., Crossover without Connection or Possibility of Connection)

─┼─ = ─┼─ or ─┼•┼─ (i.e., Can Only be Connected or Disconnected, As Input or Output, But Cannot be Broken)

─╫■╫─ = Full Interchange

─✳─ = Full Interchange

─✳─ = Partial Interchange: ─┼─ ─┴─ ─┘ ─┐ ─┴─

Lines (4 Vertical Shown) that do not have ─✳─ Intersections are Intended to be Low Skew
(i.e., Clock or Other) Paths.

─┤▷├─ = Directional Amplifier (Direction is Selectable) to Prevent Signal Drooping Through too Many Pass Devices.

FIG 4B

CONFIGURABLE LOGIC ELEMENT

FIELD OF THE INVENTION

This invention relates to a configurable logic element in general and in particular, to a configurable logic element which is composed of a configurable combinational logic element, a configurable storage element and a configurable output select logic. The output signals of the configurable storage element serve as input signals to both the configurable combinational logic and the output select logic. The output signals of the output select logic are selected from the output signals of the combinational logic element and the output signals of the storage element.

BACKGROUND OF THE INVENTION

In copending patent application Ser. No. 06/588,478, filed Mar. 12, 1984 by Ross H. Freeman and entitled "CONFIGURABLE LOGIC ARRAY" which is incorporated herein by reference, a structure is described which allows changing the configuration of a finished integrated circuit from time to time (even when the integrated circuit is installed in a system) to provide any one of a plurality of logical functions from the same integrated circuit. This is accomplished by providing a number of "configurable logical elements" (herein referred to as "configurable logic elements") each of which is capable of being configured to implement any one of a plurality of logic functions depending on the task which it is called upon to perform. By configurable logic element is meant a combination of devices which are capable of being electrically interconnected by switches operated in response to control bits stored onthe chip (or transmitted to the chip) to perform any one of a plurality of logical functions. The configurable logic element disclosed in application No. 06/588,478 may include all of the circuit elements necessary to provide one or more of the functions provided by, for example, an AND gate, flip-flop, inverter, NOR gate exclusive OR gate, and combinations of these functions to form more complex functions. The particular function to be carried out by a configurable logic element is determined by control signals applied to the configurable logic element from control logic. Depending on the control signals, a configurable logic element can function as an AND gate, an OR gate, a NOR gate, a NAND gate, or an exclusive OR gate or any one of a number of other logic functions without change in physical structure. Structure is provided on chip to allow any one of a plurality of functions to be implemented by the configurable logic element. This is done by providing control logic to store and generate control signals which control the configuration of the configurable logic element.

In one embodiment, the control signals are stored and transmitted by control logic formed integrally with and as part of the integrated circuit chip containing the configurable logic elements. However, if desired, the control information can be stored and/or generated outside the integrated circuit and transmitted through pins to the configurable logic element.

In general, a given set of control signals in the form of control bits is transmitted from the control logic to a configurable logic element to control the configuration of that configurable logic element. The actual set of control bits provided to the configurable logic element on the integrated circuit chip depends on the function to be carried out by the configurable logic element on the chip.

SUMMARY OF THE INVENTION

A configurable logic element is disclosed which provides great versatility in the selection of the function it is capable of implementing. The configurable logic element includes a combinational logic element, a storage element, and an output select logic, each of which is configured by control bits. Selected input signals to the configurable logic element together with selected "feedback" signals from the storage element are the input signals to the combinational logic element. The input signals to the configurable logic element together with the output signals of the combinational logic element provide input signals to the configurable storage element. The output select logic provides output signals which are selected from the output signals of the combinational logic element and the storage element.

This invention will be more fully understood with reference to the following detailed description and accompanying drawings.

DESCRIPTION OF THE DRAWINGS

FIG. 2 illustrates the internal logic structure of one possible configurable logic element capable of implementing a number of useful functions of two variables A and B;

FIG. 3A illustrates a 16 bit RAM circuit wherein any one of sixteen possible input states is capable of being identified and $2^{16}$ functions are capable of being implemented;

FIG. 3B illustrates a selection structure for selecting any one of sixteen bits capable of implementing $2^{16}$ functions for transmittal to an output lead;

FIG. 4A illustrates a plurality of configurable logic elements (shown as nine logic elements) formed on an integrated circuit chip together with programmable interconnects formed between selected leads to yield desired logic functions and with selected input/output pads and interconnections of the leads between logic elements;

FIG. 4B shows the key to the cross-connection between crossing conductive leads in FIG. 4A;

DETAILED DESCRIPTION

The following detailed decription of this invention is meant to be illustrative only and not limiting. Other embodiments of this invention will be obvious to those skilled in the art in view of the following disclosure.

Copending U.S. application Ser. No. 588,478, filed Mar. 12 1984, on an invention of Ross H. Freeman entitled "Configurable Logic Array" is incorporated herein by reference.

It is necessary to explain the configurable logic elements and general interconnect structure of the configurable logic array described in the above copending application in order to explain the particular configurable logic element of the present invention.

Figure 1:
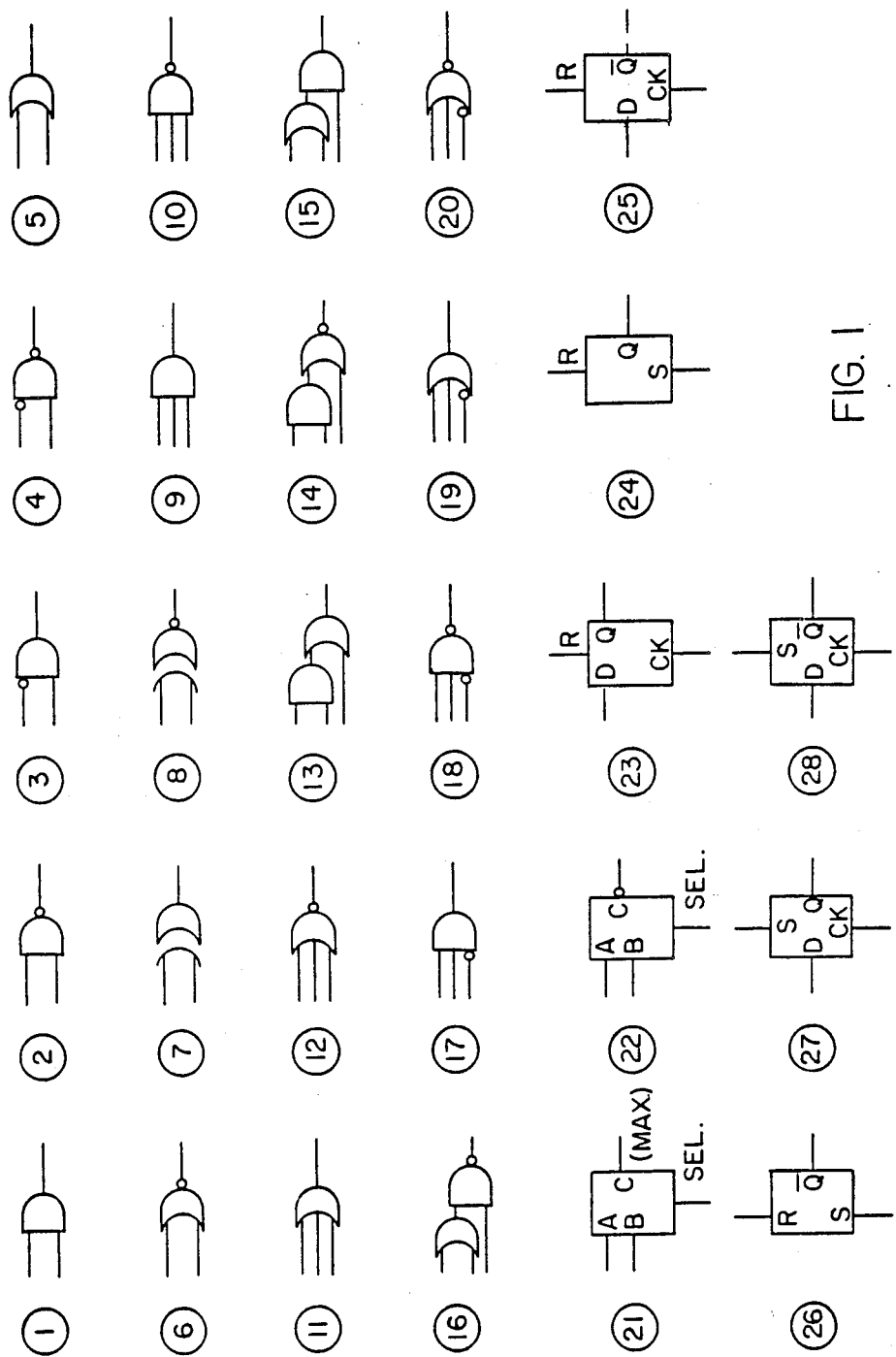
FIG. 1 illustrates some of the various logic functions capable of being implemented by a configurable logic element in a configurable logic array.

FIG. 1 illustrates certain logic functions capable of being implemented by a configurable logic element. The 28 functions shown in FIG. 1 are merely islustrative and other elements not shown can, if desired, be implemented by a configurable logic element. The following functions are shown:

| Element | Function |
| --- | --- |
| 1 | AND gate |
| 2 | NAND gate |
| 3 | AND gate with inverted input |
| 4 | NAND gate with inverted input |
| 5 | OR gate |
| 6 | NOR gate |
| 7 | exclusive OR gate |
| 8 | exclusive NOR gate |
| 9 | 3 input AND gate |
| 10 | 3 input NAND gate |
| 11 | 3 input OR gate |
| 12 | 3 input NOR gate |
| 13 | OR gate with one input comprising AND gate |
| 14 | NOR gate with one input comprising AND gate |
| 15 | AND gate with one input comprising OR gate |
| 16 | NAND gate with one input comprising OR gate |
| 17 | 3 input AND gate with one input inverted |
| 18 | 3 input NAND gate with one inverted input |
| 19 | 3 input OR gate with one inverted input |
| 20 | 3 input NOR gate with one inverted input |
| 21 | one of two inputs multiplexer |
| 22 | inverting one of two inputs multiplexer |
| 23 | "D" flip flop with reset |
| 24 | Set-Reset latch |
| 25 | "D" flip-flop with reset and inverted output |
| 26 | Set-reset latch with reset and inverted output |
| 27 | "D" flip-flop with set |
| 28 | "D" flip-flop with set and inverted output |

Of course, other logic functions can also be implemented in a configurable logic element.

FIG. 2 illustrates the internal logic structure of one possible configurable logic element which is capable of implementing all useful basic functions of the two variables A and B, with the functions being selected by configuration control signals C0, $\overline{C0}$, C1, $\overline{C1}$ . . . through C5 on control leads C0, $\overline{C0}$, . . . through C5. (In this example, all control leads are connected to the gates of N channel enhancement mode pass transistors.) To implement an AND gate function using the structure shown in FIG. 2, the input leads labeled A and B are shunted past inverters 21 and 22, respectively, to AND gate 25 by high level signals on the C1 and C0 configuration control leads which, being connected to the gates of N channel enhancement mode pass transistors 29c and 29d, cause pass transistors 29c and 29d to turn on.

Low level signals are applied to the configuration control leads $\overline{C0}$ and $\overline{C1}$, thus blocking the output signals of inverters 21 and 22 from AND gate 25. In addition, a high level signal on lead C5 is applied to enable AND gate 25. Thus three input AND gate 25 functions as a two-input AND gate with respect to the signals A and B. The output signal of AND gate 25 provides one input signal to NOR gate 26. A second input signal to NOR gate 26 is provided by the output signal of AND gate 24. The output signal of AND gate 24 is held at a logical 0 by applying a logical 0 to configuration control lead C4. Thus the control signals C2 and C3 are "don't cares", that is, these signals can be high or low without affecting the output signal of AND gate 24. Since the output signal of AND gate 24 is a logical 0, and since the tri-state control input signal to NOR gate 26 is a logical 0, it is easy to see that AND gate 25, AND gate 24 and NOR gate 26 function together as a NAND gate with respect to input signals A and B. Since the tri-state control signal input to NOR gate 27 is a logical 0 (except during reset), NOR gate 27 serves as an inverter with respect to the output signal of NOR gate 26. The output signal of NOR gate 26 is applied to the gate of N channel transistor 29a (the source of which is grounded and the drain of which is connected to output lead 28) and the complement of the output signal of NOR gate 26 is applied to the gate of N channel transistor 29b (the source of which is connected to a power supply and the drain of which is connected to both the output lead 28 and the drain of N channel transistor 29a). Thus transistors 29a and 29b function as an inverter with respect to the output signal of NOR gate 26. Thus, the structure of FIG. 2 configured as described above performs the function of an AND gate with respect to the signals A and B. Other logic functions can also be produced by appropriate selection of the control signals to be supplied to the configuration control leads C0 through C5 to activate the appropriate pass transistors and gates within the structure.

Figures 3C, 3D:
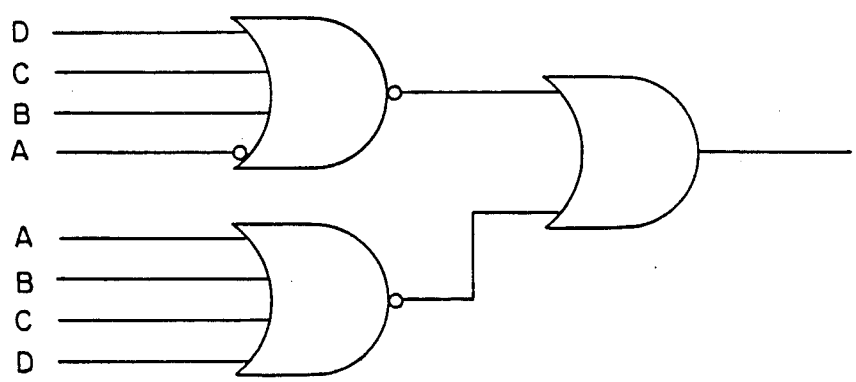
FIG. 3C illustrates one possible Karnaugh map for the structure of FIG. 3A.
FIG. 3D illustrates the logic gates represented by placing a binary one in the Karnaugh map of FIG. 3C at the intersections of the first and second rows and the first column.

FIG. 3A illustrates a 16 bit RAM capable of producing an output signal in response to any one of sixteen possible combinations of input signals. Thus input signals A and B control the X decoder to select any one of the four columns in the 16 bit RAM. Input signals C and D control the Y decoder to select any one of the four rows in the 16 bit RAM. The 16 bit RAM produces an output signal representative of the bit at the intersection of the selected row and column. There are 16 such intersections and thus sixteen such bits. There are $2^{16}$ possible combinations of functions capable of being represented by 16 bits. Thus, if a NOR gate is to be simulated by the 16 bits in the RAM, the Karnough map for the RAM would be as shown in FIG. 3C. In FIG. 3C all bits are "0" except the bit at the intersection of the first row (representing A=0, B=0) and the first column (representing C=0, D=0). Should a less frequently used function be desired to be generated by the 16 bit RAM, (for example, should a "1" output signal be desired for A=1, B=0, C=0 and D=0) then a binary "1" is stored at the intersection of the second row and the first column. Should a binary "1" be desired both when A=0, B=0, C=0 and D=0 and also when A=1, B=0, C=0 and D=0 then a binary "1" is stored at each of the intersections of the first column with the first row and the second row. The logic circuit represented by this loading of the RAM is as shown in FIG. 3D. Thus the RAM of FIG. 3A represents an elegant and simple implementation of any one of $2^{16}$ logic functions.

FIG. 3B shows another structure for yielding any one of sixteen select bits. Each of registers 0-15 in the vertical column to the left labeled "16 Select Bits", contains a selected signal, either a binary 1 or 0. By selecting the proper combination of A, B, C, and D, a particular bit stored in a particular one of the sixteen locations in the 16 Select Bits register is transmitted to the output lead. Thus, for example, to transmit the bit in the "1" register to the output lead, the signal A, B, C, D is applied to the leads so labeled. To transmit the signal labeled "15" in the sixteenth location in the 16 Select Bits register to the output lead the signal A, B, C, and D is applied to the appropriate columns. Again, any one of $2^{16}$ logic functions can be implemented using this structure.

FIGS. 4A illustrates a configurable logic array containing nine configurable logical elements. As shown in FIG. 4A, each CLE of the nine CLEs 40-1 through 40-9 has a plurality of input leads and one or more output leads. Each input lead has a plurality of access junctions each connecting a selected general interconnect lead to the input lead. The access junctions for input lead 2 of CLE 40-7 are labeled A1 through A4 in FIG. 4A. The access junctions for the other input leads are indicated schematically but are not labeled for the sake of clarity. Similarly, each output lead of each CLE has a plurality of access junctions each connecting the output lead to a corresponding one of the general interconnect leads. The access junctions are indicated schematically for each output lead of each CLE in FIG. 4A. The access junctions for the output lead of CLE 40-7 are labeled B1 through B5. The leads in FIG. 4A which are neither input leads nor output leads are called general interconnect leads and the junctions in FIG. 4A which are not access junctions for input and output leads are called general interconnect junctions. As shown in FIG. 4A, nine logic elements are placed on an integrated circuit chip together with programmable access junctions and a general interconnect structure which comprises general interconnect leads and programmable general interconnect junctions for connecting various leads to other leads. The general interconnect structure includes a set of general interconnect leads and of programmable junctions interconnecting the general interconnect leads having the property that for each general interconnect lead in the general interconnect structure there is a programming of the general interconnect junctions which connects the given general interconnect lead to one or more other leads in the general interconnect structure. Moreover, there is a programming of the junctions (both access and general interconnect) such that for any given output lead of any CLE in the CLA, and for any given input lead of any other CLE in the CLA, there is a programming of the junctions such that the given output lead is connected to the given input lead. An electrical path from a given output lead to a given input lead always contains at least two access junctions and at least a portion of a general interconnect lead. For example, one electrical path from the output lead of CLE 40-8 to the second input lead of CLE 40-9 contains access junctions A7 and B7 and the marked portion P of a general interconnect lead. Typically, an electrical path from an output lead of one CLE to an input lead of another CLE will also contain one or more general interconnect junctions. Each of logic elements 40-1 through 40-9 represents a collection of circuitry such as that shown in FIG. 2 or some similar structure capable of being configured as described above in FIG. 2 to perform any one of a number of logic functions. To program the circuitry (both the configurable interconnect switches and the configurable logic elements), selected signals are applied to input leads identified as configuration control input leads thereby to generate a desired logical function in each of the logic elements and to interconnect the logic elements as desired. In FIG. 4A, no specific lead has been identified as an input lead for the configuration control signals. However, any particular I/O pad can be selected for this purpose. The configuration control bits can be input into the configurable logic array either in series or in parallel depending upon design considerations where they are typically stored in a programming register (shown in FIG. 5). Alternatively, the configuration control bits may be stored in a memory on chip. In addition, another I/O pad will be used for an input clock signal which is used, inter alia, for the loading of the configuration control signals into the programming register. When the configurable logic array shown in FIG. 4A has been configured, selected output signals of logic elements 40-1 through 40-9 are provided to selected I/O pads. FIG. 4B illustrates the meaning of the junction symbols used in FIG. 4A.

Figure 5:
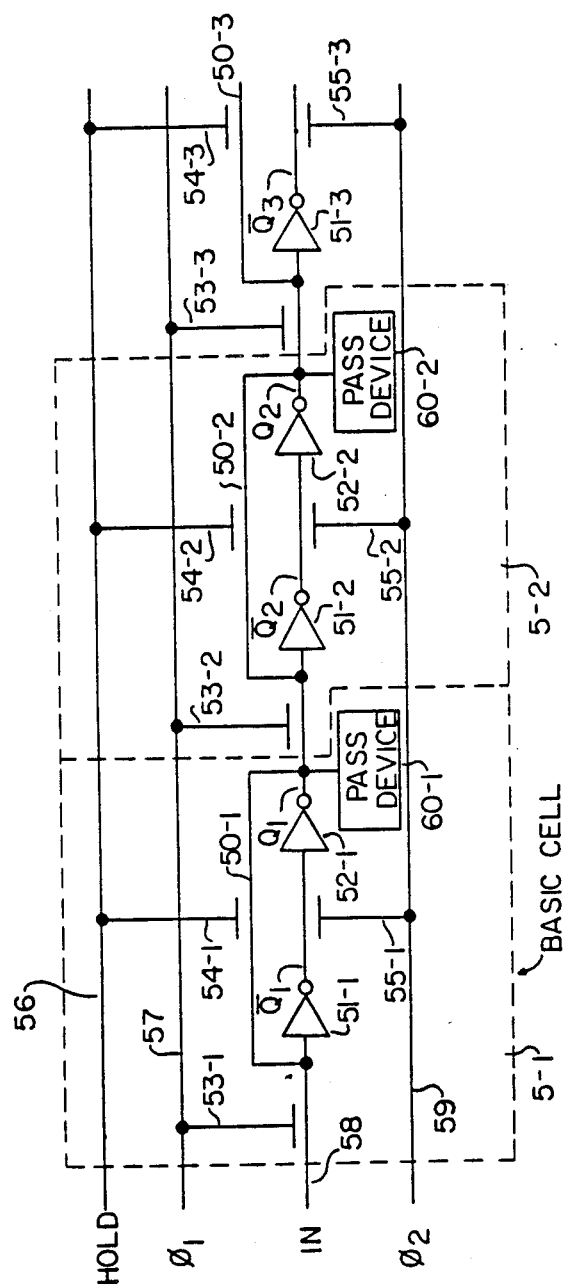
FIG. 5 represents a portion of the circuitry of a novel combination static and dynamic shift register appropriate for use with the configurable logic array of this invention.
Figure 6:
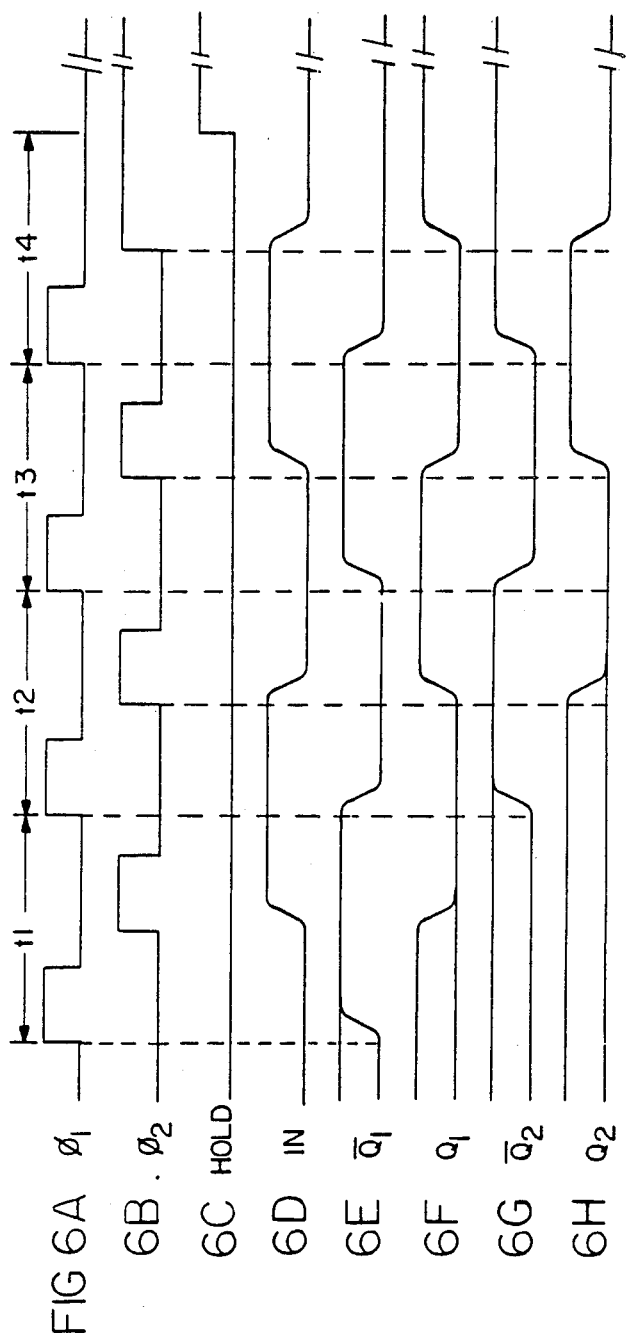
FIGS. 6A through 6H represent wave forms of use in explaining the operation of the structure of FIG. 5.

To configure a logic element such as logic element 40-1 (FIG. 4A), a number of bits must be applied to the configuration control leads such as leads C0 through C5, as shown, for example, in FIG. 2. To do this a shift register, for example, is utilized as part of each configurable logic element. FIG. 5 illustrates a shift register which may be used. The shift register of FIG. 5 is illustrated showing two basic storage cells. Each storage cell is capable of storing one bit of information. Of course, an actual shift register will contain as many storage cells as required to configure the logic element of which the shift register is a part, to its desired configuration. In operation an input signal is applied to input lead 58. This input signal (shown in FIG. 6D) contains bit stream to be stored in the shift register as configuration control bits to configure the configurable logic element to perform a desired logic function or to configure (program) an access junction or a general interconnect junction between general interconnect leads in a manner to be described shortly. Thus the sequence of pulses applied to input lead 58 represents those pulses which when stored in the storage cells of the shift register will activate the configuration control bits in the proper manner to achieve the desired functional and/or interconnection result. For example, if the circuit of FIG. 2 is to be configured to form an AND gate, the pulses C0, C1, C2, C3, C4, and C5 would be represented by 1,1,X,X, 0,1.

The sequence of pulses applied to input lead 58 is synchronized with clocking pulses $\Phi 1$ and $\Phi 2$ applied to leads 57 and 59 respectively. Thus in the first period of operation clocking pulse $\Phi 1$ goes high (FIG. 6A), clocking pulse $\Phi 2$ is low (FIG. 6B), the hold signal (FIG. 6C) is low during shifting thereby facilitating the passage of data through sequentially connected cells 5-1, 5-2 et al. of the shift register. To shift the pattern 01010 into the shift register, the following operations occur: The input signal on lead 58 is low during approximately the first half cycle of the clocking period t1. The output signal of inverter 51-1 goes to a high level in response to the low level input signal and $\Phi 1$ high to enable pass transistor 53-1. Some time through the first clocking period t1, the clock signal $\Phi 1$ goes low (FIG. 6A) and the clock signal $\Phi 2$ shortly thereafter goes high (FIG. 6B) to enable pass transistor 55-1. Consequently, the high level output signal is transmitted to the input lead of inverter 52-1 by enabled pass transistor 55-1 and thereby produces a low level output signal Q1 on the output lead of inverter 52-1. Thus at the end of period t1, the output signal Q1 (FIG. 6F) from inverter 52-1 is low level. The output signals $\overline{Q2}$ and Q2 from inverters 51-2 and 52-2 in the second cell are still indeterminate because no known signal has yet propagated to the second storage cell 5-2 to change the signals of these inverters to a known state.

At the beginning of the second period (labeled "t2" in FIG. 6A), Φ1 goes high (FIG. 6A) and Φ2 is low (FIG. 6B) having gone low before period t1 ended. The input signal (FIG. 6D) now has risen to a high level representing a binary 1 and thus the output signal $\overline{Q1}$ of inverter 51-1 has gone low. The output signal Q1 of inverter 52-1 remains low because pass transistor 55-1 is held off by the low level Φ2 signal. Some time through the second period Φ1 goes low followed a fraction of time later by Φ2 going high. At this time, the output signal $\overline{Q1}$ is transmitted through pass transistor 55-1 to inverter 52-1 thereby driving the output signal Q1 from inverter 52-1 to high level. Meanwhile, during period t2 the previous low level signal on Q1 has driven the output signal $\overline{Q2}$ of inverter 51-2 to a high level when Q1 was at a high level to enable pass transistor 53-2 and the change in Φ2 from a low level to a high level in the second half of period t2 to enable pass transistor 55-2 drives the output signal Q2 from inverter 52-2 to a low level. In this manner, the input signal on lead 58 (FIG. 6D) is transmitted through each of the cells 5-1, 5-2, 5-3 et al. in the shift register. Upon the transfer into the shift register of the desired information, the hold signal (FIG. 6C) is enabled (i.e., driven to a high level) thereby to connect the feedback leads 50-1, 50-2, and 50-3 et al. from the output leads of inverters 52 to the input leads of inverters 51 so as to hold the information then in each cell indefinitely. In operation, the signal stored in a given cell e.g. 5-1 is connected to a configuration control or to an interconnect pass device, such as devices 60-1 and 60-2, illustrated schematically in FIG. 5.

The output signals Q1, $\overline{Q}_1$, Q2, $\overline{Q}_2$, etc., of the shift register are directly connected to the (configuration) control inputs of a logic element or the pass devices of the general interconnect junctions.

When Φ1 is low, Φ2 and hold may be brought high, thus holding the data indefinitely. The entire shift register may be set or cleared by setting or clearing the input with Φ1 and Φ2 both high and HOLD low. Enough set/reset time must be allowed for the signal to propagate the entire length of the shift register to clear the shift register in this manner. Naturally this time is dependent upon the length of the shift register.

The shift register operates in its dynamic phase by storing the information being shifted as charge on the gates of the transistors (not shown in FIG. 5 but well-known) comprising inverters 51-1, 52-1, 51-2, 52-2 et al. of the shift register. These inverters are of well-known design and will not be described in detail. The use of a dynamic shift register is important because a dynamic shift register uses six transistors and thus takes up very little area. The dynamic shift register is converted to a static latch by adding only one transistor. Thus the dynamic shift register (static latch) can be easily fabricated as part of a configurable logic element without adding significant complexity to the circuit or consuming significant semiconductor area. Because of the "hold" signal, the dynamic shift register can become a static latch because placing the shift register on hold automatically refreshes the data. Thus a separate refresh circuit is not needed.

It is apparent from the above description that the dynamic shift register (static latch) circuit does not need refreshing once it has been latched into a hold state. This is accomplished by use of the feedback circuit comprising lead 50-1 and pass transistor 54-1 in cell 5-1, for example.

Figure 7:
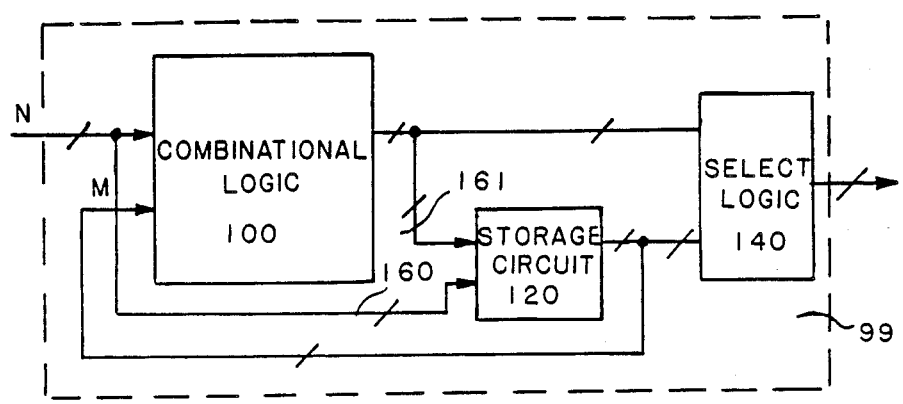
FIG. 7 shows a configurable logic element according to the present invention.

FIG. 7 shows a block diagram of the configurable logic element 99 of the present invention which includes configurable combinational logic 100, configurable storage circuit 120 and configurable output select logic 140. The combinational logic 100 receives the N binary input signals to the configurable logic element 99 and M binary "feedback" signals from storage circuit 120. Combinational logic 100 is configurable into a plurality of configurations Each configuration implements one or more selected combinational logic functions of one or more selected subsets of the input signals to the combinational logic. Since combinational logic 100 is configurable, it can be employed to implement a variety of different functions. Moreover, two or more selected functions may be implemented simultaneously, appearing on separate output leads of the configurable logic element 100. In more detail, combinational logic 100 selects K binary input signals from among its M+N binary input signals ($K \leq M+N$). Combinational logic circuit 100 is responsive to a plurality of sets of values of a first set of configuration signals including at least a first set of values for which configurable combinational logic 100 implements a first set of functions, each of which is a function of some of said K binary signals, and a second set of values for which configurable combinational logic 100 implements a second set of functions, each of which is a function of some of said K binary signals, where said first set of functions is not the same as said second set of functions. In one embodiment combinational logic 100 has a first configuration which implements a selectable 1 of the $2^{2^K}$ binary valued functions of these K binary signals and a second configuration which implements both a selectable 1 of the $2^{2^{(K-1)}}$ binary valued functions of a first selected (K−1) of the K selected binary input signals and a selectable 1 of the $2^{2^{(K-1)}}$ binary value functions of a second selected (K−1) of the K selected binary input signals. (The second set of K−1 signals need not be distinct from the first set.) The operation of combinational logic 100 will be more readily understood after a consideration of the specific embodiment described in FIG. 8 which is explained hereafter.

Storage circuit 120 is also configurable and may be programmed to implement, depending on the configuration, one or more storage elements each of which may be, for example, a transparent latch with set and reset, a D flip-flop with set and reset, an edge detector, a stage of a shift register, or a stage of a counter. Configurable storage circuit 120 receives the output signals of combinational logic 100 on bus 161 as well as a clock signal and selected ones of the N input signals of combinational logic 100 on input bus 160. Output select logic 140 is configured to provide output signals which are selected from among the output signals of the combinational logic element and the storage circuit.

Figure 8:
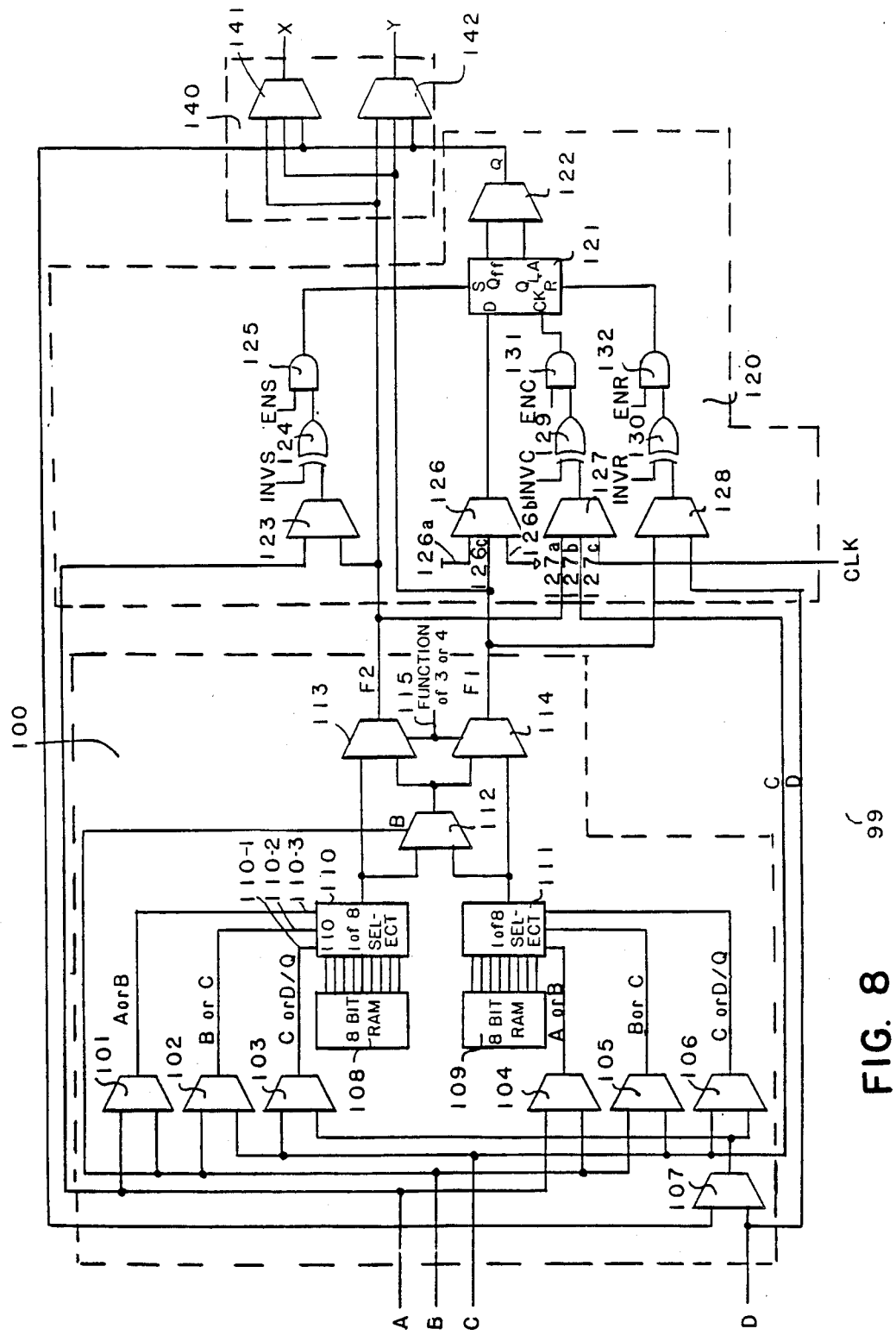
FIG. 8 shows one embodiment of the configurable logic element of FIG. 7.

FIG. 8 shows the details of one embodiment of the configurable logic element 99 in FIG. 7. In FIG. 8, the four input signals to the configurable logic element 99 are denoted by A, B, C, D (i.e., N=4). Since the storage circuit 120 provides only a single feedback signal Q to switch 107, M=1. In FIG. 8, K=4 since the signals A, B, C and either D or Q are selected from among the five signals A, B, C, D, and Q. Configurable combinational logic element 100 includes configurable switches 101 through 107, 113, and 114, 8-bit RAMs 108 and 109, one of eight select logics 110 and 111, multiplexer 112, and configuration control lead 115 to switches 113 and 114. Each of the configurable switches is configured by control bits from a programming register (not shown) on leads (not shown except for lead 115) as previously explained. Switch 101 may be configured to provide signal A as its output signal or it may be configured to provide signal B as its output signal. Similarly, each of the switches 102 through 107 may be configured to provide a selected 1 of its two input signals as its output signal. Thus, for example, for one selection of configuration control bits, switch 107 provides signal D and the binary signals A, C, and D are provided to both one of eight select logic 110 and one of eight select logic 111 by switches 101 through 103 and 104 through 107, respectively. For each of the eight possible combinations of binary signals A, C and D, select logic 110 selects a unique storage element in RAM 108 and outputs the bit stored in the selected location. One of eight select logic 111 operates similarly with respect to 8-bit RAM 109. Multiplexer 112 provides either the output signal from select logic 110 or the output signal from select logic 111, depending on the state of signal B. For this configuration, the control bit applied on lead 115 causes switches 113 and 114 to simultaneously pass the output signal from multiplexer 112 to output leads F1 and F2 of combinational logic element 100. The two 8-bit RAMs 108 and 109 can be programmed with binary bits in $2^{16}$ different ways. Each choice of programming of the 8-bit RAMs causes the combinational logic of element 100 to implement one of the $2^{16} = 2^{24}$ possible logic functions of the four binary variables A, B, C and D. (Here K=4.) (A logic function is a binary valued function of binary variables.)

For another selection of configuration control bits, switch 107 provides feedback signal Q from storage circuit 120 and switches 101 through 103 and 104 through 107 and 113 and 114 are configured as before. Then the combinational logic element 100 implements of the $2^{16} = 2^{24}$ possible logic functions of the four binary variables A, B, C and Q for each choice of programming of the two 8 bit rams 108 and 109. (Here again K=4.)

For another selection of configuration control bits, switches 101 through 103 provide signals A, C and Q, and switches 104 through 106 provide signals B, C, and Q, respectively, and the control signal applied to lead 115 causes switches 113 and 114 to provide the output signal of select 110 on lead F2 and the output signal of select 111 on lead F1, respectively. Thus, this configuration implements on lead F1 one of the $2^8 = 2^{23}$ logic functions of the three binary variables A, C, and Q for each of the $2^8$ possible programmings of 8-bit RAM 108 and on lead F2 implements one of the $2^8$ logic functions of the three binary variables B, C and Q for each of the $2^8 = 2^{23}$ possible programmings of RAM 109.

In general, for any first selection of three of the four variables A, B, C and D/Q, and for any second selection of three of the four variables A, B, C and D/Q, there is a configuration of the combinational logic element 100 which implements one of the $2^{23}$ logic functions of the first selection of three variables on output lead F2 for each of the $2^8$ possible programmings of 8-bit RAM 108 and one of the $2^{23}$ logic functions of the second selection of three variables on output lead F1 for each of the $2^8$ possible programmings of RAM 109.

In another embodiment (not shown), each of the 8-bit RAMs may be "subdivided" by providing each with two additional one of four select logic so that any four binary functions of two of the variables A, B, C and D/Q are implemented on four additional output leads of the combinational logic element 100. Similarly, in another embodiment (not shown) a 32 bit RAM and the signals A, B, C, and D and the feedback signal Q are all used (so that K=5) to implement in one configuration one of the $2^{25}$ binary functions corresponding to each programing of the 32 bit RAM (here N=4, M=1, and K=5) In another configuration (not shown) N=4, M=1, K=5, and a first binary function F1 of the variables A, B, C a second binary function F2 of the variables B, C, D and a third binary function F3 of the variables B, C, D, Q are implemented. It is important to observe that $2^{K1'} + 2^{K2'} + 2^{K3'} = 2^K$ where $K_i$ is the number of variables of which $F_i$ is a function for i=1, 2, 3. Returning to FIG. 8, it is also important to observe that configurable switches 101, 102 and 103 select a subset of their input signals and provide the selected subset of input signals on a one-to-one basis to selected input leads of circuit 110. For example, in response to one set of values of configuration signals, configurable switches 101, 102 and 103 provide signal A to lead 110-3, signal B to lead 110-2, and signal C to lead 110-1.

The output signals on leads F1 and F2 are input signals to configurable storage circuit 120. Signals A, C, and D are also input signals to storage circuit 120. Configurable storage circuit 120 includes programmable switches 122, 123, 126, 127 and 128, exclusive OR gates 124, 129 and 130, AND gates 125, 131 and 132, and storage element 121. Storage element 121 has a set, reset, data and clock input leads denoted by S, R, D and Ck, respectively, and output leads $Q_{FF}$ and $Q_{LA}$.

Switches 123, 126, 127 and 128 are each configured to select one of their input signals as an output signal. The set, clock, and reset functions associated with the set, clock, and reset input leads of storage element 121 are all active high but each may be rendered active low relative to the output signal of switches 123, 127 and 129 respectively by applying a logical 1 to the leads INVS, INVC, and INVR of exclusive or gates 124, 129 and 130 respectively. (If a logical 0 is applied to leads INVS, INVC, and INVR, the polarity of the output signals of the exclusive-or gates 124, 129, and 130 is the same as that of the input signals. If a logical 1 is applied to leads INVS, INVC, and INVR, the output signals of exclusive-or gates 124, 129, and 130 are the inverse of the input signals.)

The AND gates 125, 131, and 132 are enabled by applying a logical 1 to the input leads ENS, ENC, and ENR respectively (and disabled by applying a logical 0). If a logical 0 is applied to one of the input leads ENS, ENC, or ENR, the output of the AND gate is a logical 0 and the associated function of memory circuit 121 is disabled regardless of the state of the corresponding exclusive OR gate. $Q_{FF}$ provides a flip-flop output signal and $Q_{LA}$ provides a latch output signal as explained later in conjunction with FIG. 9. Configurable switch 122 selects one of the binary singals on leads $Q_{FF}$ and $Q_{LA}$ and the output signal Q of switch 122 is an input signal to the output select logic 140 and to the configurable combinational logic 100.

Figure 9:
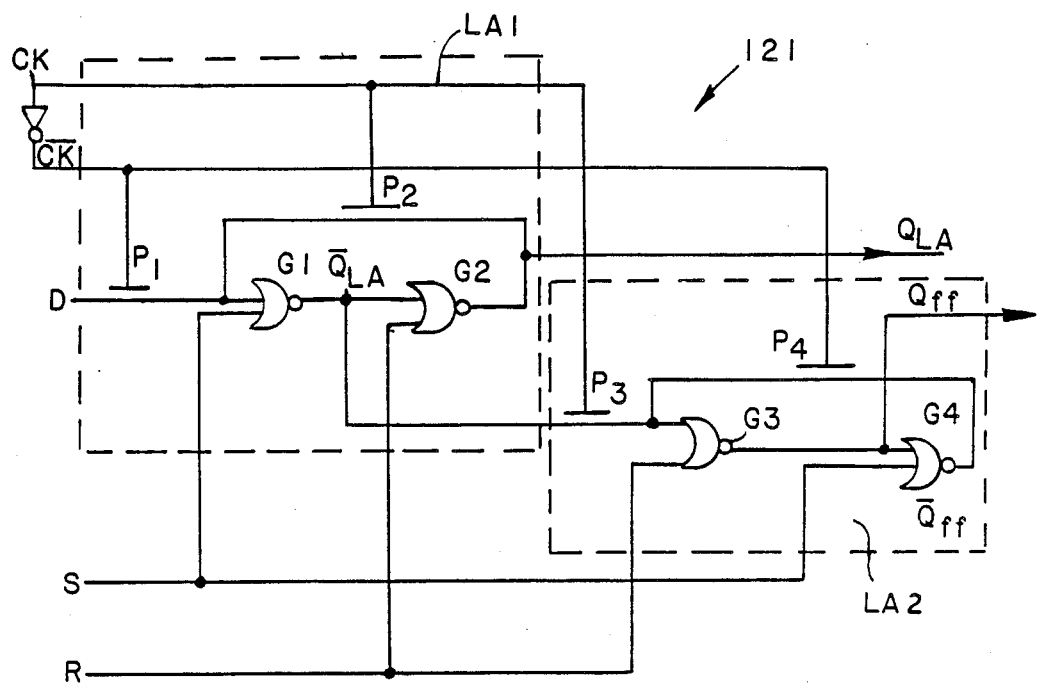
FIG. 9 shows one embodiment of the storage element 121 of FIG. 8.

FIG. 9 shows one embodiment of memory circuit 121. Memory element 121 comprises two "D" latches LA1 and LA2 connected in series thereby implementing a flip-flop. Latch LA1 includes N channel pass transistors P1 and P2 and NOR gates G1 and G2. The gates of pass transistors $P_1$ and $P_2$ are controlled by the signals $\overline{CK}$ and CK, respectively. Similarly, latch LA2 includes N channel pass transistors P3 and P4 and NOR gates G3 and G4. The gates of transistors P3 and P4 are controlled by the signals CK and $\overline{CK}$, respectively. The D input lead is the data input lead of latch LA1. The S input lead serves as the set input lead of latch LA1 and as the reset input lead of latch LA2. The R input lead serves as the reset input lead of latch LA1 and as the set input lead of latch LA2.

The output signal $\overline{Q}_{LA}$ of NOR gate G1 is connected to the data input lead of latch LA2. The output lead $Q_{LA}$ is connected to the output lead of NOR gate G2 of latch LA1 and the output lead $Q_{FF}$ is connected to the output lead of NOR gate G3 of latch LA2.

Configurable storage circuit 120 (FIG. 8) operates as a transparent latch with set and reset by configuring switch 122 to connect output lead Q to output lead $Q_{LA}$. The output signal on lead $Q_{LA}$ follows the input signal while the clock signal CK is low. The output signal on $Q_{LA}$ is held when the clock signal CK goes high, turning off pass transistor P1 and turning on pass transistor P2. Thus, the data signal is transmitted to output lead $Q_{LA}$.

Storage circuit 120 may also be configured to operate as a D flip-flop with set and reset. In this configuration, switch 126 is configured to select the signal on lead $F_1$ and gates 125, 131 and 132 are enabled by applying a logical 1 to leads ENS, ENC, and ENR, respectively. Finally, switch 122 is configured to select the output signal on lead $Q_{FF}$ of storage element 121. Storage element 120 may also be configured as a D flip-flop without set and reset by modifying the above configuration by applying a logical zero to leads ENS and ENR.

Configurable storage circuit 120 may also be configured to be an RS latch by enabling AND gates 125 and 132, and disabling AND gate 131 so that a logical 0 input signal is provided on the Ck input lead of storage element 121. The logical 0 on lead Ck turns off pass transistor P3 and turns on pass transistor P4. Switch 122 is then configured to select the output signal on $Q_{FF}$.

Finally, storage circuit 120 may also be configured to be an edge detector. For example, to configure storage element 120 as a rising edge detector, AND gate 125 is disabled to provide a logical 0 on input lead S, AND gate 131 is enabled to pass a clock signal to input lead Ck, and switch 126 is configured to select input lead 126a so that a logical 1 is provided to input lead D. AND gate 132 is enabled. A logical 1 reset signal forces the output signal on $Q_{FF}$ to a logical 0. A low clock signal turns off pass transistor P2 and P3 and turns on pass transistor P1, permitting NOR gate G1 to invert the logical 1 on lead D, thus providing a logical 0 on node $\overline{Q}_{LA}$. When the clock signal rises, transistors P1 and P4 are turned off, transistors P2 and P3 are turned on, and the logical 0 on node $\overline{Q}_{LA}$ is inverted by NOR gate 23, thus providing a logical 1 on output lead $Q_{FF}$ which signals that a rising edge has been detected. $Q_{FF}$ is then reset to 0 using the reset input and the edge detector is then ready to detect the next rising edge. (Note that when the clock signal falls, transistors P2 and P3 are turned off and transistor P4 is turned on, and the signal on $Q_{FF}$ remains a logical 0 and does not change state until the next rising edge.)

Similarly, storage circuit 120 may be configured as a falling edge detector by applying a logical one signal to lead INVC of exclusive-or gate 129. Clearly, storage circuit 120 may also serve as a stage of a shift register or a stage of a counter.

The output select logic 140 includes configurable switches 141 and 142 which are each configured to select an output signal from among the output signals on leads F1 and F2 from the combinational logic 100 and the output signal of storage element 120.

The above embodiments are intended to be exemplary and not limiting. It will be obvious in view of the disclosures made above that various substitutions and modifications may be made without departing from the spirit and scope of the invention.

In the claims which follow, the phase "means having a configuration in which said means" performs a particular function is used in place of the detailed wording "means which are capable of being configured in response to a selected set of values of a set of configuration signals and which, when configured by said selected set of values," performs a particular function.

I claim:

1. A configurable logic element comprising:
   means for receiving a first plurality of N binary input signals;
   means for receiving a second plurality of M binary feedback signals;
   means for selecting K of said M+N binary signals (where K≦N+M);
   combinational logic means for receiving said K binary signals from said means for selecting, said combinational logic means having a plurality of configurations including at least
      a first configuration in which said combinational logic means generates a first set of binary output signals, each of which represents a function of some of said K binary signals and
      a second configuration in which said configurable combinational logic means generates a second set of binary output signals, each of which represents a function of some of said K binary signals, wherein the set of functions represented by said first set of binary signals is not the same as the set of functions represented by said second set of binary signals;
   a configurable storage circuit comprising:
      a plurality of input leads for receiving a plurality of input signals, said input signals corresponding to said input leads on a one-to-one basis, said input signals comprising selected ones of said binary output signals of said combinational logic means and selected ones of said N binary input signals,
      memory means for storing data, said memory means having at least a first and a second input lead and at least one output lead;
      first means having a first configuration in which said first means provides a first selected one of said input signals of said configurable storage circuit to said first input lead of said memory means
      second means having a first and a second configuration in which said second means provides a second and a third selected one, respectively of said input signals of said configurable storage circuit to said second input lead of said memory means, said memory means generating said second plurality of M binary signals in response to said signals provided by said first and said second means; and a configurable select logic comprising:
  means for receiving said output signals generated by said combinational logic means and said M binary signals generated by said configurable storage circuit, and
  means for selecting output signals from among the signals received by said select logic.

2. A configurable logic element as in claim 1 wherein said second means of said configurable storage circuit has a third configuration in which said second means provides the complement of said second selected one of said input signals to said second input lead of said memory means.

3. A configurable logic element comprising:
  means for receiving a first plurality of N binary input signals;
  means for receiving a second plurality of M binary feedback signals;
  means for selecting K of said M+N binary signals of said first and said second plurality (where $K \leq N+M$);
  configurable combinational logic means comprising
    first configurable means for receiving said K binary input signals, said first configurable means having at least a first configuration in which said first configurable means generates a first set of output signals said first set being a first subset of said K input signals, and a second configuration in which said first configurable means generates a second set of output signals said second set being a second subset of said K input signals, wherein said first set is not equal to said second set;
    first memory means having a plurality of storage locations, each of said storage locations for storing a binary bit;
    first location selection means for receiving said output signals of said first configurable means and for selecting a storage location within said first memory means in response to said output signals of said first configurable means and for providing a first output signal representing the binary bit stored in said selected storage location within said first memory;
  a configurable storage circuit comprising:
    a plurality of input leads for receiving a plurality of input signals said input signals corresponding to said input leads on a one-to-one basis, said input signals comprising selected ones of said output signals of said first location selection means and selected ones of said N binary input signals,
    memory means for storing data, said memory means having at least a first and a second input lead and at least one output lead;
    first means having a first configuration in which said first means provides a first selected one of said input signals of said configurable storage circuit to said first input lead of said memory means;
    second means having a first and a second configuration in which said second means provides a second and a third selected one, respectively, of said input signals of said configurable storage circuit to said second input lead of said memory means, said memory means generating said second plurality of M binary signals in response to said signals provided by said first and said second means; and a configurable select logic comprising:
    means for receiving the output signals produced by said first location selection means of said combinational logic and said M binary signals; and
    means for selecting output signals from among the signals received by said select logic.

4. A configurable logic element as in claim 3 wherein said configurable combinational logic means further comprises:
  second configurable means for receiving said K binary input signals, said second configurable means having at least a first configuration in which said second configurable means generates a third set of output signals, said third set being a third subset of said K input signals, and a second configuration in which said second configurable means generates a fourth set of output signals, said fourth set being a fourth subset of said K input signals wherein said third set is not equal to said fourth set;
  second memory means having plurality of storage locations, each of said storage locations for storing a binary bit;
  second location selection means for receiving said output signals of said second configurable means and for selecting a storage location within said second memory means in response to said output signals of said second configurable means, said second location selection means providing a second output signal representing the data bit stored in said selected storage location within said second memory;
  steering logic means for receiving said first and said second output signals of said first and said second location selection means, said steering logic means having a first configuration in which said steering logic means provides a first output signal equal to said first output signal of said first location selection means and a second output signal equal to said second output signal of said second location selection means, said steering logic means having a second configuration in which said steering logic means provides an output signal equal to a selected one of said first and said second output signals of said first and said second location selection means,
  wherein said input signals of said configurable storage circuit further comprise selected ones of said output signals of said steering logic means
  and wherein said means for receiving the output signals in said configurable select logic receives said output signals of said steering logic means.

5. A configurable logic element as in claim 4 wherein said second means of said configurable storage circuit has a third configuration in which said second means provides the complement of said second selected one of said input signals to said second input lead of said memory means 6. A configurable logic element as in claim 4 wherein the number of signals in each of said first, said second, said third and said fourth sets of output signals of said first and second configurable means of said configurable combinational logic means is L where L is a selected positive integer less than or equal to K.

7. A configurable logic element as in claim 6 wherein $L = K - 1$.

8. A configurable logic element as in claim 7 wherein said first memory means comprises $2^{K-1}$ storage locations, each of said storage locations being capable of being programmed and reprogrammed and wherein said second memory means comprises $2^{K-1}$ storage locations, each of said storage locations being capable of being programmed and reprogrammed.

9. A configurable logic element as in claim 1, 2, 6, 7, or 8 wherein said second means of said configurable storage circuit includes means for generating a first constant signal and has a fourth configuration in which said second means provides said first constant signal to said second lead.

10. A configurable logic element as in claim 9 wherein said first means of said configurable storage circuit includes means for generating a second constant signal and means for generating a third constant signal and wherein said first means has a second and a third configuration in which it provides said second and said third constant signal, respectively, to said first input lead 11. A configurable logic element as in claim 10 wherein said first input lead of said memory of said configurable storage circuit is a data input lead, said second input lead of said memory means of said configurable storage circuit is a clock input lead, and wherein said memory means further comprises a set and a reset input lead.

12. A configurable combinational logic circuit comprising:
first configurable means for receiving K binary input signals, said first configurable means having at least a first configuration in which said first configurable means generates a first set of output signals said first set being a first subset of said K input signals, and a second configuration in which said first configurable means generates a second set of output signals said second set being a second subset of said K input signals wherein said first set is not equal to said second set;
first memory means having a plurality of storage locations, each of said storage locations for storing a binary bit;
first location selection means for receiving said output signals of said first configurable means and for selecting a storage location within said first memory means in response to said output signals of said first configurable means and for providing a first output signal representing the binary bit stored in said selected storage location within said first memory.

13. A configurable combinational logic circuit as in claim 12 further including:
second configurable means for receiving said K binary input signals, said second configurable means having at least a first configuration in which said second configurable means generates a third set of output signals, said third set being a third subset of said K input signals, and a second configuration in which said second configurable means generates a fourth set of output signals, said fourth set being a fourth subset of said K input signals, wherein said third set is not equal to said fourth set;
second memory means having a plurality of storage locations, each of said storage locations for storing a binary bit;
second location selection means for receiving said output signals of said second configurable means and for selecting a storage location within said second memory means in response to said output signals of said second configurable means, said second location selection means providing a second output signal representing the data bit stored in said selected storage location within said second memory; and
steering logic means for receiving said first and said second output signals of said first and said second location selection means, said steering logic means having a first configuration in which said steering logic means provides a first output signal equal to said first output signal of said first location selection means and a second output signal equal to said second output signal of said second location selection means, said steering logic means having a second configuration in which said steering logic means provides an output signal equal to a selected one of said first and said second output signals of said first and said second location selection means.

14. A configurable logic element as in claim 13 wherein the number of signals in each of said first, said second, said third and said fourth sets of output signals is L where L is a selected positive integer less than or equal to K.

15. A configurable logic circuit as in claim 14 wherein $L = K - 1$.

16. A configurable logic element as in claim 15 wherein said first memory means comprises $2^{K-1}$ storage locations, each of said storage locations being capable of being programmed and reprogrammed and wherein said second memory means comprises $2^{K-1}$ storage locations, each of said storage locations being capable of being programmed and reprogrammed.

17. A configurable storage circuit comprising:
memory means for storing data said memory means having at least a first and a second input lead;
a first set of one or more input leads corresponding to said first input lead each input lead of said first set for receiving a corresponding input signal;
a second set of one or more input leads corresponding to said second input lead, each input lead of said second set for receiving a corresponding input signal;
first means which, for each given lead in said first set, has a corresponding configuration in which said first means provides the input signal on said given lead to said first input lead;
second means which, for each given lead in said second set, has a corresponding first configuration in which said second means provides the input signal on said given lead to said second lead;
said memory means generating one or more output signals in response to said signals provided by said first means and said second means.

18. A configurable storage circuit as in claim 17 wherein said second means, for some given lead in said second set, has a corresponding second configuration for providing the complement of the signal on said some given lead to said second lead.

19. A configurable storage circuit as in claim 17 wherein said second means includes means for generating a first constant signal and has a configuration in which said second means provides said first constant signal to said second lead.

20. A configurable storage circuit as in claim 19 wherein said first means includes means for generating a second constant signal and means for generating a third constant signal and wherein said first means has a first and a second additional configuration in which it provides said second and said third constant signals, respectively, to said first input lead.

21. A configurable logic element comprising:
means for receiving a first plurality of N binary input signals;
means for receiving a second plurality of M binary feedback signals;
means for selecting K of said M+N binary signals (where $K \leq N+M$);
combinational logic means for receiving said K binary signals from said means for selecting, said configurable combinational logic means having a plurality of configurations for generating binary output signals;
a configurable storage circuit for receiving selected ones of said binary output signals of said configurable combinational logic means and selected ones of said N binary input signals and for generating said M binary feedback signals said configurable storage circuit having a plurality of configurations; and
a configurable select logic comprising means for receiving said output signals generated by said combinational logic means and said M binary signals generated by said configurable storage circuit and means for selecting output signals from among the signals received by said select logic.

* * * * *

UNITED STATES PATENT AND TRADEMARK OFFICE
CERTIFICATE OF CORRECTION

PATENT NO. : 4,706,216
DATED : November 10, 1987
INVENTOR(S) : William S. Carter It is certified that error appears in the above-identified patent and that said Letters Patent is hereby corrected as shown below:

Col. 1, line 35, "onthe" should read --on the--.

Col. 2, line 54, "cross-connection" should read --cross-connections--.

Col. 3, line 18, "islustra-" should read --illustra--.

Col. 4, line 29, "Thus" should read --Thus,--.

Col. 5, line 10, "B", "C", and "D" should have bars across the top.

Col. 6, line 61, after "signal" insert --$\overline{Q1}$--.

Col. 6, line 67, after "signal" insert --$\overline{Q1}$--.

Col. 9, line 44, after "implements" insert --one--.

Col. 11, line 28, "P1" should read --$P_1$--.

Claim 1, col. 12, line 67, after "respectively" insert a comma.

Claim 4, col. 14, line 23, after "signals" insert a comma.

Claim 5, col. 14, line 62, after "means" insert a period.

Claim 8, col. 15, lines 4 and 7, the "1" in the number should be part of the exponent.

UNITED STATES PATENT AND TRADEMARK OFFICE
CERTIFICATE OF CORRECTION

PATENT NO. : 4,706,216

DATED : November 10, 1987

INVENTOR(S) : William S. Carter

It is certified that error appears in the above-identified patent and that said Letters Patent is hereby corrected as shown below:

Claim 11, col. 15, line 25, after "memory" insert --means--.

Claim 16, col. 16, line 34, the "1" in the number should be part of the exponent.

Signed and Sealed this

Twenty-seventh Day of September, 1988

Attest:

DONALD J. QUIGG

Attesting Officer     Commissioner of Patents and Trademarks